United States Patent
Ma et al.

(10) Patent No.: US 6,652,666 B2
(45) Date of Patent: Nov. 25, 2003

(54) WET DIP METHOD FOR PHOTORESIST AND POLYMER STRIPPING WITHOUT BUFFER TREATMENT STEP

(75) Inventors: Ching-Tien Ma, Kaohsiung (TW); Chen-Hsi Shih, Yung Kang (TW); Dian-Hau Chen, Hsin-Chu (TW); Gau-Ming Lu, Taipei (TW); Cho-Ching Chen, Tainan (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 363 days.

(21) Appl. No.: 09/847,631

(22) Filed: May 2, 2001

(65) Prior Publication Data

US 2002/0162578 A1 Nov. 7, 2002

(51) Int. Cl.[7] .............................. B08B 3/04; B08B 7/04; C03C 15/00
(52) U.S. Cl. .............................. 134/30; 134/19; 134/38; 134/902
(58) Field of Search .............................. 216/95, 41, 49, 216/83, 91; 510/176, 175; 134/19, 38, 26, 29, 30, 42, 902

(56) References Cited

U.S. PATENT DOCUMENTS

| 5,419,779 A | * | 5/1995 | Ward ............................ 134/38 |
| 5,545,289 A | * | 8/1996 | Chen et al. ................. 438/694 |
| 5,928,430 A | * | 7/1999 | Ward et al. .................. 134/1.3 |
| 5,988,186 A | * | 11/1999 | Ward et al. .................. 134/1.3 |
| 6,127,097 A | * | 10/2000 | Bantu et al. ................. 430/315 |
| 2002/0124875 A1 | * | 9/2002 | Chang et al. ................. 134/30 |
| 2002/0162579 A1 | * | 11/2002 | Wang et al. .................. 134/26 |

* cited by examiner

Primary Examiner—Alexander Markoff
(74) Attorney, Agent, or Firm—Tung & Associates

(57) ABSTRACT

A wet dip method for photoresist and polymer stripping from a wafer surface without the need for a buffer solvent treatment step is disclosed. In the method, the wafer is first exposed to an etchant solution that is maintained at a temperature of at least 80° C. The wafer is then cooled in a room temperature air for a sufficient length of time until the temperature of the wafer reaches substantially room temperature. The wafer is then rinsed in a rinsing step that includes a quick dump rinse and a final rinse with deionized water that is maintained at a temperature not higher than room temperature without first exposing the wafer to a buffer solvent such as that required in a conventional wet dip method.

22 Claims, 1 Drawing Sheet

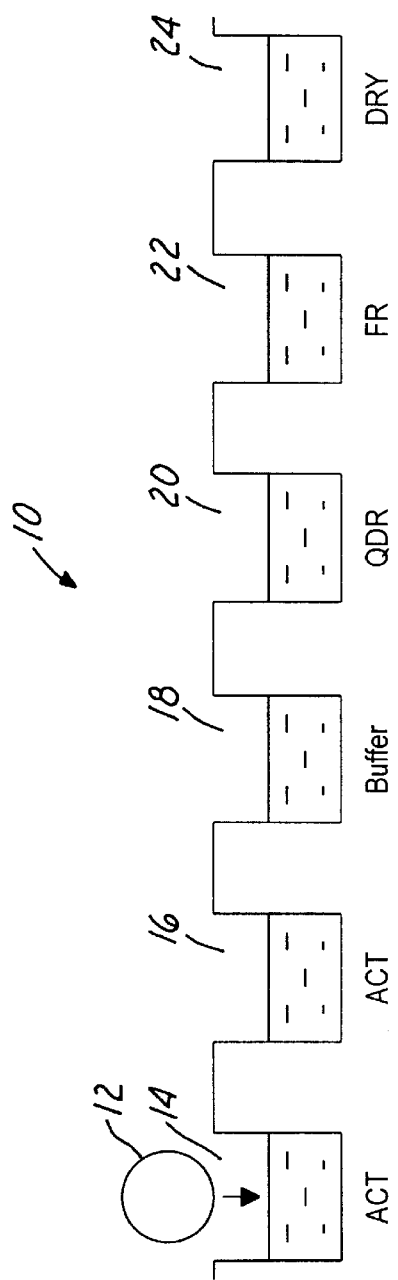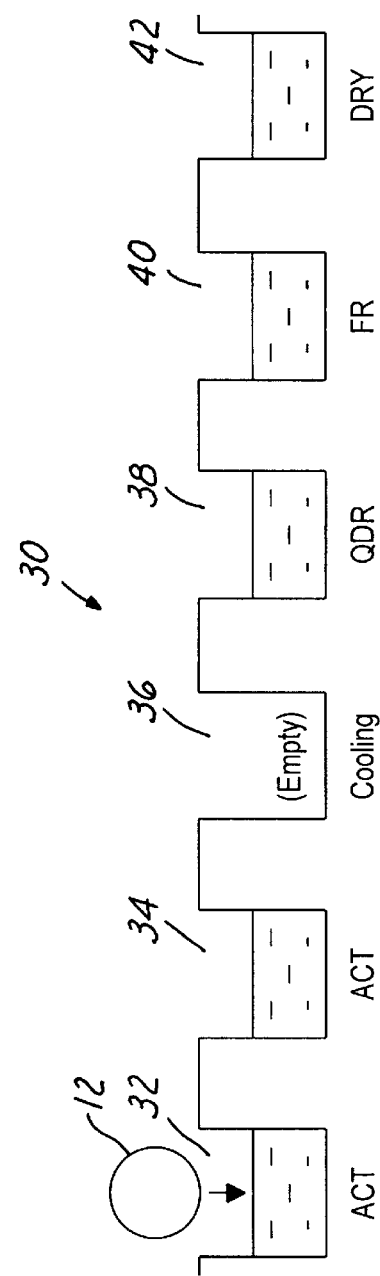

WET DIP METHOD FOR PHOTORESIST AND POLYMER STRIPPING WITHOUT BUFFER TREATMENT STEP

FIELD OF THE INVENTION

The present invention generally relates to a wet dip method for semiconductor processing and more particularly, relates to a wet dip method for removing a photoresist or polymer layer from a wafer surface without the need for a buffer solvent treatment step.

BACKGROUND OF THE INVENTION

In the fabrication of semiconductor devices, various processing steps are started with a photolithographic process to first define a circuit on the wafer. For instance, in a modern memory device, multiple layers of metal conductors are required for providing a multi-layer metal interconnect structure. As the number of layers of metal interconnects increase, while the device geometry continuously decreases to allow more densely packed circuits, the photolithographic process required to define patterns of circuits becomes more complicated and difficult to carry out.

After a process for forming metal vias or lines in an insulating layer is completed, not only a photoresist layer must be stripped, a sidewall passivation polymer layer must also be removed. The sidewall passivation layer is formed to enhance the etch directionality and to improve the etch anisotropy. The passivation can be carried out by adjusting the etchant gas composition and reactor parameters such that an etch-inhibiting film is formed on the vertical sidewall of a via or a trench hole. The passivation layer slows down or stops lateral etching by the etchant gas while the etching of horizontal surfaces continues. The oxide growth is prevented on horizontal surfaces since the surfaces are exposed to ion bombardment. The sidewall passivation layer can also be deposited by choosing a greater atomic ratio of carbon to fluorine in a fluorocarbon plasma. When a suitable chemistry is selected, involatile polymer films can be deposited on the sidewalls of via or line cavities to form a coating that blocks attack from etchant gas. The sidewall passivation is a very useful method for preserving linewidth control especially when an isotropic etchant such as a fluorine or chlorine gas is used.

After a via or line etching process is completed, the sidewall passivation layer or the polymeric film must be removed before the wafer can be further processed. The sidewall polymer cannot be removed in a conventional photoresist strip chamber where only a microwave or a decoupled source plasma is used for stripping photoresist layers after metal etching. As a result, it is necessary to subject the wafer to a separate wet etching process for removing the sidewall polymer. For instance, a wet stripping process can be implemented after a photoresist dry stripping process by utilizing a wet etchant such as ACT® 690C or ECK® 265 to remove the sidewall polymer after a metal etching process and a photoresist dry stripping process. The ACT® 690C is a mixture of DMSO (dimethyl-sulphuroxide), MEA (mono-ethyl-amine) and catechol, while EKC® 265 is a mixture containing HDA (hydroxy-amine). The conventional wet dip process requires a special buffer solvent treatment step in order to avoid or minimize metal corrosion problems in the circuits already formed on the wafer surface.

Wet etching is a frequently used technique for stripping photoresist films from silicon wafers where the complete removal of resist images without adversely affecting the wafer surface is desired. The resist layer or images should be completely removed without leaving any residues, including contaminant particles that may have been present in the resist. The underlying surface of the photoresist layer should not be adversely affected, for instance, accidental etching of the metal or oxide surface should be avoided. Liquid etchant strippers should produce a reasonable bath yield in order to prevent redeposition of dissolved resist on the wafers. The etchant should completely dissolve the photoresist layer in a chemical reaction, and not just lifting or peeling so as to prevent redeposition. It is also desirable that the etching or stripping time be reasonably short in order to permit high wafer throughput.

Wet etchants such as sulfuric acid ($H_2SO_4$) and mixture of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts 30% $H_2O_2$, or a mixture of 88% sulfuric acid and 12% nitric acid. Wafers to be stripped can be immersed in the mixture at a temperature between about 100° C. and about 150° C. for 5~10 minutes and then subjected to a thorough rinse of deionized water and dried in dry nitrogen. This type of inorganic resist strippers, such as the sulfuric acid mixtures, is very effective in the residual-free removal of highly post-baked resist. They are more effective than organic strippers and the longer the immersion time, a cleaner and more residue-free wafer surface can be obtained.

A conventional wet dip process is shown in a flow chart 10 in FIG. 1. In the conventional wet dip process for removing a photoresist or polymer layer from a surface of a wafer 12, the wafer is first dipped into an ACT® bath 14 for conducting a first etch reaction. The ACT® solution is normally maintained at a temperature higher than room temperature. After a suitable time period of immersing in the ACT® solution, the wafer 12 is moved to the second ACT® bath 16 and again immersed for a suitable length of time. The wafer 12 is then immersed in a buffer solvent bath 18 to substantially neutralize the residual acid solution on the wafer surface. The buffer solvent bath 18 may contain a solvent such as isopropyl alcohol or NMP. The wafer 12 is immersed in the buffer solvent for a sufficient length of time so as to neutralize all residual acid on the wafer surface. The immersing time in the buffer solvent is at least 10 minutes. The wafer 12 is then moved to a quick dump rinse tank 20 for a quick dump rinse by deionized water. The quick dump rinse process is followed by a final rinse carried out in a final rinse bath 22 with deionized water. After the wafer 12 is thoroughly rinsed, it is dried in a drying tank 24.

The conventional photoresist or polymer stripping process shown in FIG. 1 requires the neutralizing step of immersing in the buffer solvent bath 18. Since the buffer solvent bath 18 is kept at a temperature similar to that of the ACT® bath 16, i.e. at a temperature somewhat higher than 100° C., any incomplete neutralized acid left on the wafer surface can be very active at such high temperature for reacting with metal lines or vias formed on the wafer surface. The reaction leads to the corrosion of metal lines or vias and subsequently, serious defects or failure in the circuit formed on the wafer surface.

It is therefore an object of the present invention to provide a wet dip process for removing photoresist and polymer from a wafer surface that does not have the drawbacks or shortcomings of the conventional methods.

It is another object of the present invention to provide a wet dip process for removing photoresist and polymer from a wafer surface without the need of a buffer solvent treatment step.

It is a further object of the present invention to provide a wet dip method for photoresist and polymer stripping without a buffer solvent treatment step that does not require the utilization of any other processing equipment.

It is another further object of the present invention to provide a wet dip method for photoresist and polymer stripping from a wafer surface without a buffer solvent treatment step by first cooling down the wafer after an etch process before a quick dump rinse step.

It is still another object of the present invention to provide a wet dip method for photoresist and polymer stripping without a buffer solvent treatment step in which the wafer is cooled after the etching step in an empty tank until the wafer temperature reaches room temperature before a quick dump rinse step is executed.

It is yet another object of the present invention to provide a wet dip method for photoresist and polymer stripping from a wafer surface without a buffer solvent treatment step by first cooling the wafer to room temperature in room temperature air after the etching step before the quick dump rinse step is carried out.

SUMMARY OF THE INVENTION

In accordance with the present invention, a wet dip method for removing photoresist and polymer layers from a wafer surface without the need for a buffer solvent treatment step is disclosed.

In a preferred embodiment, a wet dip process for removing a surface layer on a wafer can be carried out by first exposing the wafer to an etchant solution maintained at a temperature of at least 80° C. for at least 5 min; cooling the wafer in room temperature air for a sufficient length of time until a temperature of the wafer reaches substantially room temperature; and rinsing the wafer with water that is maintained at a temperature not higher than room temperature without first exposing the wafer to a buffer solvent.

The wet dip process for removing a surface layer from a wafer may further include the step of exposing the wafer to an etchant solution that includes dimethyl-sulphur-oxide, mono-ethylamine and catechol. The method may further include the step of exposing the wafer to an etchant solution that includes hydroxyamine. The method may further include the step of exposing the wafer to an etchant solution maintained at a temperature between about 80° C. and about 150° C., or the step of exposing the wafer to an etchant solution for a time period between about 10 min. and about 40 min. The cooling step may be conducted in an empty tank, or in an empty tank for a time period of at least 5 min. The rinsing step may further include the sub-steps of a quick dump rinse and a final rinse, the rinsing step may be conducted with deionized water. The method may further include the step of drying the wafer after the rinsing step, or drying the wafer after the rinsing step by alcohol vapor.

The present invention is further directed to a wet dip method for removing a photoresist or polymer layer from a wafer surface which can be carried out by the steps of immersing the wafer in a first etchant solution maintained at a temperature of at least 100° C. for at least 5 min; immersing the wafer in a second etchant solution maintained at a temperature of at least 100° C. for at least 5 min; cooling the wafer in room temperature air for a length of time that is sufficient for the wafer to reach substantially room temperature; and rinsing the wafer with deionized water to substantially remove the first and the second etchant solutions from the wafer surface without first exposing the wafer surface to a buffer solution.

The wet dip method for removing a photoresist or polymer layer from a wafer surface may further include the step of selecting the first and second etchant solution from at least one member of the group consisting of dimethyl-sulphur-oxide, monoethyl-amine, catechol and hydroxyamine. The first etchant solution may be the same as the second etchant solution, or the first etchant solution may be different than the second etchant solution. The method may further include the step of immersion the wafer in the first and second etchant solutions for a total time period of at least 20 min., or the step of immersion the wafer in the first and second etchant solutions that are maintained at a temperature between about 100° C. and about 150° C. The method may further include the step of cooling the wafer in room temperature air in an empty tank, or the step of cooling the wafer in room temperature air for a time period of at least 5 min. The rinsing step may further include the sub-steps of a quick dump rinse and a final rinse, or the sub-steps of a quick dump rinse and a final rinse by deionized water. The method may further include the step of drying the wafer after the rinsing step by alcohol vapor.

BRIEF DESCRIPTION OF THE DRAWINGS

These and other objects, features and advantages of the present invention will become apparent from the following detailed description and the appended drawings in which:

FIG. 1 is a flow chart illustrating a conventional wet dip process for removing photoresist and polymer layers from a wafer surface incorporating a buffer solvent treatment step.

FIG. 2 is a flow chart of the present invention wet dip method for photoresist and polymer stripping from a wafer surface that utilizes an empty tank cooling step instead of a buffer solvent neutralizing step.

DETAILED DESCRIPTION OF THE PREFERRED EMBODIMENT

The present invention discloses a wet dip process for removing a surface layer such as photoresist or polymer from a wafer which can be carried out without a buffer solvent treatment step.

The method can be carried out by first exposing the wafer surface to an etchant solution that is maintained at a temperature of at least 80° C. for at least 5 min; then cooling the wafer in room temperature air for a sufficient length of time until a temperature of the wafer reaches substantially room temperature; and then rinsing the wafer with water that is maintained at a temperature not higher than room temperature without first exposing the wafer to a buffer solvent. The etchant solution used for the wet dip process for removing photoresist and polymer may contain at least one of dimethyl-sulphur-oxide, mono-ethyl-amine, catechol and hydroxyamine. The etchant solution that contains at least one of the above components should be maintained at a temperature between about 80° C. and about 150° C., at preferably between about 100° C. and about 130° C. The wafer should be exposed to the etchant solution for a time period that is sufficiently long as to remove all photoresist or polymer layers from the wafer surface. In a preferred embodiment, a suitable time period is between about 10 min. and about 40 min., or preferably between about 20 min. and about 30 min.

The present invention cooling step can be advantageously conducted in an empty tank, and thus called "empty tank cooling process" wherein the empty tank contains room temperature air. The term "room temperature air" is defined as air environment of air which has a temperature between about 18° C. and about 23° C. A suitable cooling period is any time period that is longer than 5 min., for instance, a time period of 10 min.

The rinsing step for the present invention wet dip process of the wafer is conducted by exposing the wafer surface to deionized water that has been maintained at a temperature not higher than room temperature. The rinsing step can be carried out by the sub-steps of first a quick dump rinse (QDR) step followed by a final rinse step. A suitable solvent used in both sub-steps can be deionized water. The present invention wet dip process for photoresist and polymer stripping may further include a final step of drying. For instance, a suitable drying method is one that utilizes a Maragoni dryer which incorporates the use of alcohol vapor such as isopropyl alcohol vapor.

The present invention novel wet dip process can also be carried out by two separate etching steps in two separate tanks. For instance, the wafer may be first immersed in a first etchant solution in the first tank that is maintained at a temperature of at least 100° C. for a time period of at least 5 min., the wafer is then immersed in a second etchant solution in a second tank that is maintained at the same temperature for the same amount of time. The etchant in the first tank may be the same, or may be different than the etchant in the second tank. The total immersing time in the first and the second etchant solutions may be at least 20 min., when the etchant solutions are maintained at a temperature between about 100° C. and about 150° C.

Referring now to FIG. 2, wherein a present invention wet dip process is shown in a flow chart 30. The present invention wet dip process can be started by first immersing a wafer 12 into a first etch tank 32 that holds an etchant solution such as ACT. The ACT® solution is kept at a temperature between about 80° C. and about 150° C., and preferably between about 100° C. and about 130° C. In a preferred embodiment, the ACT® solution is kept at 115° C. After a suitable immersing time period, i.e. such as a time period between about 10 min. and about 40 min., and preferably between about 10 min. and about 30 min., and more preferably for about 15 min., the wafer 12 is removed from tank 32 and immersed in a second etch tank 34 which also contains an ACT® etchant solution. The second etchant solution contained in etch tank 34 may be the same as the first etch tank 32, or may be different than the first etch tank 32. After a suitable time period which may be similar to that of the immersing time for the first etch tank, i.e. between about 10 min. and about 40 min., the etch process for removing photoresist and polymer layers from the wafer surface is completed.

The wafer 12 is then removed from the second etch tank 34 and placed in an empty tank 36 for cooling in room temperature air. A suitable cooling time period may be at least 5 min., and preferably at least 10 min. After the wafer temperature reaches substantially room temperature, i.e. between about 18° C. and about 23° C., the wafer 12 is removed from the empty tank 36 and positioned in a quick dump rinse tank 38. In the quick dump rinse tank 38, a quick dump rinse process is then carried out by utilizing deionized water to substantially remove any residual acid of ACT®, or any component of ACT® from the surface of wafer 12. The quick dump rinse process is carried out by utilizing deionized water that is kept at a temperature not higher than room temperature.

After the quick dump rinse process is conducted in the tank 38, the wafer 12 is removed and placed in a final rinse tank 40 for a final rinse step by immersing in deionized water and then removed. The wafer 12 is then dried in a drying apparatus 42, a suitable drying apparatus for use in the present invention preferred embodiment is one that utilizes alcohol vapor. A suitable drying apparatus is a Maragoni dryer that utilizes isopropyl alcohol vapor for drying a wafer surface.

The present invention wet dip method for photoresist and polymer stripping from a wafer surface without the need for a buffer solvent treatment step has therefore been amply described in the above description and in the appended drawing of FIG. 2.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wet dip process for removing a surface layer on a wafer comprising the steps of:
    exposing said wafer to an etchant solution maintained at a temperature of at least 80° C. for at least 5 min;
    cooling said wafer in room temperature air for a sufficient length of time until a temperature of the wafer reaches substantially room temperature; and
    rinsing said wafer with water that is maintained at a temperature not higher than room temperature without first exposing said wafer to a buffer solvent.

2. A wet dip process for removing a surface layer on a wafer according to claim 1 further comprising the step of exposing said wafer to an etchant solution that comprises dimethyl-sulphur-oxide, mono-ethyl-amine and catechol.

3. A wet dip process for removing a surface layer on a wafer according to claim 1 further comprising the step of exposing said wafer to an etchant solution that comprises hydroxyamine.

4. A wet dip process for removing a surface layer on a wafer according to claim 1 further comprising the step of exposing said wafer to an etchant solution maintained at a temperature between about 80° C. and about 150° C.

5. A wet dip process for removing a surface layer on a wafer according to claim 1 further comprising the step of exposing said wafer to an etchant solution for a time period between about 10 min. and about 40 min.

6. A wet dip process for removing a surface layer on a wafer according to claim 1, wherein said cooling step being conducted in an empty tank.

7. A wet dip process for removing a surface layer on a wafer according to claim 1, wherein said cooling step being conducted in an empty tank for a time period of at least 5 min.

8. A wet dip process for removing a surface layer on a wafer according to claim 1, wherein said rinsing step further comprises the sub-steps of a quick dump rinse and a final rinse.

9. A wet dip process for removing a surface layer on a wafer according to claim 1, wherein said rinsing step being conducted with deionized water.

10. A wet dip process for removing a surface layer on a wafer according to claim 1 further comprising the step of drying said wafer after said rinse step.

11. A wet dip process for removing a surface layer on a wafer according to claim 1 further comprising the step of drying said wafer after said rinse step by alcohol vapor.

12. A wet dip process for removing a photoresist or polymer layer from a wafer surface comprising the steps of:

immersing said wafer in a first etchant solution maintained at a temperature of at least 100° C. for at least 5 min;

immersing said wafer in a second etchant solution maintained at a temperature of at least 100° C. for at least 5 min;

cooling said wafer in room temperature air for a length of time that is sufficient for the wafer to reach substantially room temperature; and rinsing said wafer with deionized water to substantially remove said first and second etchant solution from said wafer surface without first exposing said wafer surface to a buffer solvent.

13. A wet dip process for removing a photoresist or polymer layer from a wafer surface according to claim 12 further comprising the step of selecting said first and second etchant solution from at least one member of the group consisting of dimethyl-sulphur-oxide, mono-ethyl-amine, catechol and hydroxyamine.

14. A wet dip process for removing a photoresist or polymer layer from a wafer surface according to claim 12, wherein said first etchant solution is the same as said second etchant solution.

15. A wet dip process for removing a photoresist or polymer layer from a wafer surface according to claim 12, wherein said first etchant solution is different than said second etchant solution.

16. A wet dip process for removing a photoresist or polymer layer from a wafer surface according to claim 12 further comprising the step of immersing said wafer in said first and second etchant solutions for a total time period of at least 20 min.

17. A wet dip process for removing a photoresist or polymer layer from a wafer surface according to claim 12 further comprising the step of immersing said wafer in said first and second etchant solutions that are maintained at a temperature between about 100° C. and about 150° C.

18. A wet dip process for removing a photoresist or polymer layer from a wafer surface according to claim 12 further comprising the step of cooling said wafer in room temperature air in an empty tank.

19. A wet dip process for removing a photoresist or polymer layer from a wafer surface according to claim 12 further comprising the step of cooling said wafer in room temperature air for a time period of at least 5 min.

20. A wet dip process for removing a photoresist or polymer layer from a wafer surface according to claim 12, wherein said rinsing step further comprises the sub-steps of a quick dump rinse and a final rinse.

21. A wet dip process for removing a photoresist or polymer layer from a wafer surface according to claim 12, wherein said rinsing step further comprises the sub-steps of a quick dump rinse and a final rinse by deionized water.

22. A wet dip process for removing a photoresist or polymer layer from a wafer surface according to claim 12 further comprising the step of drying said wafer after said rinsing step by alcohol vapor.

* * * * *